United States Patent
Jain et al.

(10) Patent No.: US 10,566,999 B2
(45) Date of Patent: Feb. 18, 2020

(54) LOW-DENSITY PARITY CHECK DECODING

(71) Applicant: LANTIQ BETEILIGUNGS-GMBH & CO. KG, Neubiberg (DE)

(72) Inventors: Raj Kumar Jain, Bangalore (IN); Ravindra Singh, Bangalore (IN)

(73) Assignee: Lantiq Beteiligungs-GmbH & Co. KG, Neubiberg (DE)

( * ) Notice: Subject to any disclaimer, the term of this patent is extended or adjusted under 35 U.S.C. 154(b) by 105 days.

(21) Appl. No.: 15/525,485

(22) PCT Filed: Nov. 18, 2015

(86) PCT No.: PCT/EP2015/076974
§ 371 (c)(1),
(2) Date: May 9, 2017

(87) PCT Pub. No.: WO2016/079185
PCT Pub. Date: May 26, 2016

(65) Prior Publication Data
US 2017/0366201 A1 Dec. 21, 2017

Related U.S. Application Data

(60) Provisional application No. 62/081,591, filed on Nov. 19, 2014.

(51) Int. Cl.
*H03M 13/11* (2006.01)
*H03M 13/00* (2006.01)

(52) U.S. Cl.
CPC .... *H03M 13/1131* (2013.01); *H03M 13/1148* (2013.01); *H03M 13/616* (2013.01)

(58) Field of Classification Search
CPC ......... H03M 13/1131; H03M 13/1148; H03M 13/616; H03M 13/1117; H03M 13/6577
See application file for complete search history.

(56) References Cited

U.S. PATENT DOCUMENTS

| 7,103,819 B2 | 9/2006 | Kikuchi et al. |
| 8,291,292 B1 | 10/2012 | Varnica et al. |

(Continued)

FOREIGN PATENT DOCUMENTS

| CN | 101106437 A | 1/2008 |
| KR | 20030016720 A | 3/2003 |

OTHER PUBLICATIONS

Daesun, Oh et al, "Min-Sum Decoder Architectures With Reduced Word Length for LDPC Codes," IEEE Transactions on Circuits and Systems—1: Regular Papers, vol. 57, No. 1, Jan. 2010. 12 pages.

(Continued)

*Primary Examiner* — Phung M Chung
(74) *Attorney, Agent, or Firm* — Eschweiler & Potashnik, LLC

(57) ABSTRACT

A coded signal is received via a physical channel. The coded signal is encoded by a parity check matrix. In some examples, the coded signal is low density parity check-encoded. The coded signal is decoded to determine a result signal. Said decoding alternatingly updates, for each one of a number of iterations, bit node values representing bits of the result signal and check node values representing constrains of the parity check matrix. In some examples, the decoding determines the result signal at a first precision and updates at least partly at a second precision which is lower than the first precision. In further examples, the number of iterations is dynamically adjusted.

13 Claims, 7 Drawing Sheets

(56) References Cited

U.S. PATENT DOCUMENTS

| | | | |
|---|---|---|---|
| 9,178,533 B2 | 11/2015 | Park et al. | |
| 2010/0169735 A1* | 7/2010 | Biscondi | H03M 13/1117 |
| | | | 714/752 |
| 2011/0246849 A1 | 10/2011 | Rault et al. | |
| 2014/0053037 A1 | 2/2014 | Wang et al. | |

OTHER PUBLICATIONS

Huang, Tzu-Hsuan et al, "Efficient Check-Node-Stopped LDPC Decoder Design." IEEE ISCE 2014 156994530. 4 pages.

Cai, Z.H. et al. "Efficient Early Stopping Method for LDPC Decoding Based on Check-Node Messages." Asilomar 2008, IEEE 2008. 4 pages.

Wang, Jun et al. "An Early Stopping Criterion for LDPC Decoder Based on CMMB Standard." 2012 5th International Conference on BioMedical Engineering and Informatics (BMEI 2012), 4 pages.

Darabiha, Ahmad et al. "A Bit-Serial Approximate Min-Sum LDPC Decoder and FPGA Implementation," 2006 IEEE. ISCAS 2006, 4 pages.

International Search Report, dated Apr. 13, 2016 for PCT/EP2015/076974.

* cited by examiner

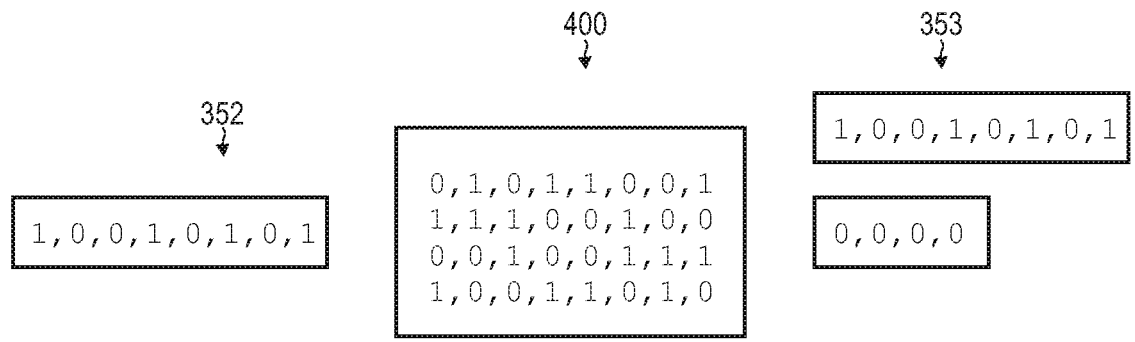
FIG. 4
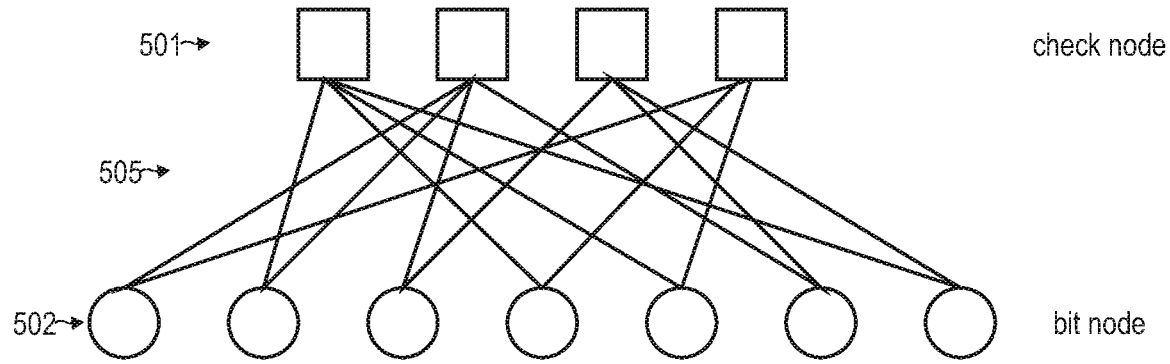
FIG. 5A
```
//------ BIT NODE UPDATE: compute new Q; -----
1) for (g2 = 0; g2 < rowwt_LUT[row]; g2++) {
2)     col  = col_LUT(g_cum2 + g2);
3)     sval = shift_LUT(g_cum2 + g2);
4)     for (pc = 0; pc < b; pc++) {
5)         if (col == CNU.index[pc])
6)             Rmag = CNU.min[pc][1];
7)         else
8)             Rmag = CNU.min[pc][0];
9)         if (Rsgn_out[g2][pc] == 1)
10)            Rji_pc = -Rmag;
11)        else
12)            Rji_pc = Rmag;
13)        Q_pc = Q[g2][pc] + Rji_pc;
14)        mem_Qi[col][(pc+sval)%b] = Q_pc;
```
FIG. 5B ic # LOW-DENSITY PARITY CHECK DECODING

REFERENCE TO RELATED APPLICATIONS

This application is a National Phase entry application of International Patent Application No. PCT/EP2015/076974 filed on Nov. 18, 2015 which claims priority to U.S. Provisional Application 62/081,591 filed on Nov. 19, 2014 the contents of which are herein incorporated by reference in their entirety.

TECHNICAL FIELD

Various embodiments relate to a method of decoding a coded signal to determine a result signal by alternatingly updating, for each one of a number of iterations, bit node values representing bits of the result signal and check node values representing constraints of a parity check matrix, and to corresponding devices.

BACKGROUND

Low-density parity check (LDPC) codes are employed to protect communication via noisy physical channels such as copper wires or an air interface. LDPC codes add an extra amount of redundant information to a coded signal communicated via a physical channel in order to enable reconstruction of errors that are present due to noise on the physical medium (Forward Error Correction, FEC).

Different techniques of decoding LDPC-encoded signals are known, e.g., the so-called min-sum algorithm, see, e.g., A. Darabiha et. al., A Bit-Serial Approximate Min-Sum LDPC Decoder and FPGA Implementation in IEEE Proc. Circuits and Systems (2006): section A "LDPC codes and min-sum decoding". Various decoding techniques rely on check nodes and bit nodes which constraints of the LDPC-code and bits of the result signal, respectively. Typically, bit node values and check node values are alternatingly updated for each one of a number of iterations. Iterations are aborted upon convergence.

Reference implementations of the min-sum algorithm face certain restrictions and drawbacks. E.g., a time to convergence can be comparably long, thus limiting a data throughput and/or requiring considerable amounts of calculation power. Further, it has been observed that applying the min-sum algorithm in certain scenarios—in particular with significant noise is present on the physical channel—can even prevent the algorithm from converging at all.

SUMMARY

Therefore, a need exists for advanced techniques of decoding a coded signal to determine a result signal. In particular, a need exists for advanced techniques of decoding a LDPC-encoded signal based on a min-sum algorithm.

This need is met by the features of the independent claims. The dependent claims define embodiments.

According to various embodiments, a method is provided. The method comprises receiving a coded signal via a physical channel. The coded signal is encoded by a parity check matrix. The method further comprises decoding the coded signal to determine a result signal. Decoding alternatingly updates, for each one of a number of iterations, bit node values and check node values. The bit node values represent bits of the result signal. The check node values represent constraints of the parity check matrix. The decoding determines the result signal at a first precision and updates at least partly at a second precision which is lower than the first precision.

E.g., the precision may correlate with a bit-length of messages used for updating and a bit length with which the bit node values and check node values are stored. Higher (lower) precision may correspond to a higher (lower) bit-length of the messages, i.e., to a higher (lower) bit-width.

According to various embodiments, a method is provided. The method comprises receiving a coded signal via a physical channel. The coded signal is encoded by a parity check matrix. The method further comprises decoding the coded signal to determine a result signal. Said decoding alternatingly updates, for each one of a number of iterations, bit node values and check node values. The bit node values represent bits of the result signal and the check node values represent constraints of the parity check matrix. The method further comprises dynamically adjusting the number of iterations for different executions of said decoding.

According to various embodiments, a device is provided. The device comprises a receiver configured to receive a coded signal via a physical channel. The coded signal is encoded by a parity check matrix. The device further comprises at least one processor configured to decode the coded signal to determine a result signal. Said decoding alternatingly updates, for each one of a plurality of iterations, bit node values representing bits of the result signal and check node values representing constraints of the parity check matrix. Said decoding determines the result signal at a first precision and updates at least partly at a second precision lower than the first precision.

According to various embodiments, a computer program product is provided. The computer program product comprises program code that may be executed by at least one processor. Executing the program code by the at least one processor causes the at least one processor to perform a method. The method comprises receiving a coded signal via a physical channel. The coded signal is encoded by a parity check matrix. The method further comprises decoding the coded signal to determine a result signal. Decoding alternatingly updates, for each one of a number of iterations, bit node values and check node values. The bit node values represent bits of the result signal. The check node values represent constraints of the parity check matrix. The decoding determines the result signal at a first precision and updates at least partly at a second precision which is lower than the first precision.

According to various embodiments, a computer program product is provided. The computer program product comprises program code that may be executed by at least one processor. Executing the program code by the at least one processor causes the at least one processor to perform a method. The method comprises receiving a coded signal via a physical channel. The coded signal is encoded by a parity check matrix. The method further comprises decoding the coded signal to determine a result signal. Said decoding alternatingly updates, for each one of a number of iterations, bit node values and check node values. The bit node values represent bits of the result signal and the check node values represent constraints of the parity check matrix. The method further comprises dynamically adjusting the number of iterations for different executions of said decoding.

It is to be understood that the features mentioned above and features yet to be explained below can be used not only in the respective combinations indicated, but also in other combinations or in isolation, without departing from the scope of the present invention. Features of the above-mentioned aspects and embodiments may be combined with each other in other embodiments.

BRIEF DESCRIPTION OF THE DRAWINGS

In the following, the invention will be explained in further detail with respect to embodiments illustrated in the accompanying drawings.

FIG. 4 schematically illustrates encoding a signal based on a parity check matrix.

FIG. 5A schematically illustrates check nodes and bit nodes of a graph employed for decoding the coded signal.

FIG. 5B illustrates source code for updating bit nodes when decoding the coded signal.

DETAILED DESCRIPTION OF EMBODIMENTS

Figure 1:
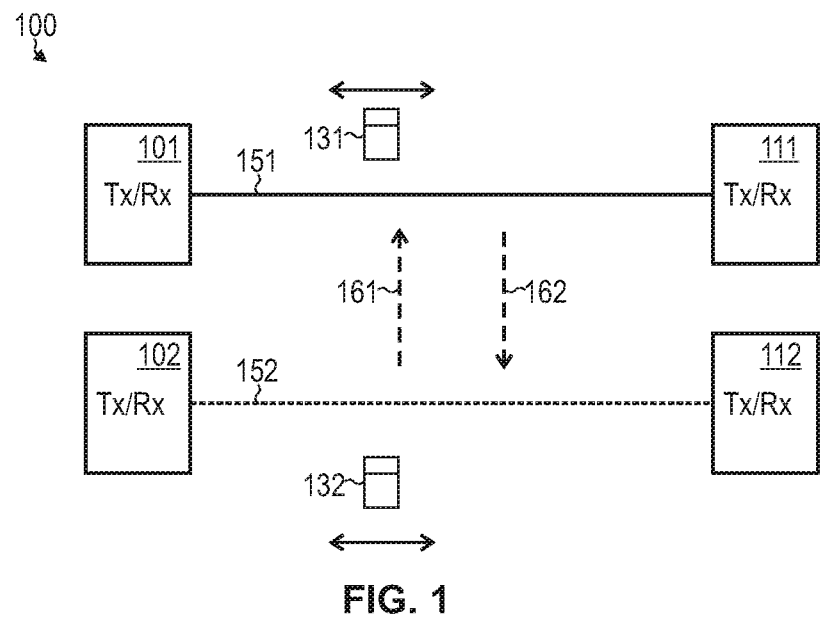
FIG. 1 schematically illustrates communication via a physical channel experiencing noise.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of decoding a coded signal are illustrated. The coded signal is encoded by a parity check matrix. In particular, various examples are given with respect to a LDPC-encoded signal; however, respective techniques may be readily applied to other kinds of parity check matrix-based encoding techniques. In particular, for LDPC-encoded signals, the parity check matrix can be a sparse matrix. LDPC-encoded signals are protected to some degree against transmission errors due to noisy on a physical channel. FEC is possible.

Decoding may rely on bit node values and check node values which are alternatingly updated for each one of a number of iterations. The number of iterations may be predefined and/or certain checks for convergence may be performed on-the-fly during decoding.

Formulating the decoding problem using a graph notation is a known way to facilitate decoding. Sometimes, the respective graph is denoted Forney's factor graph or bipartite graph. The graph comprises bit nodes and check nodes. In such a graph notation, the bit node values represent bits of the result signal and the check node values represent constraints of the parity check matrix. In particular, constraints imposed by the parity check matrix are translated into message paths between the bit nodes and check nodes, respectively, wherein all check nodes are connected with bit nodes via respective edges depending on the constraints imposed by the parity check matrix. E.g., if the bit node value is smaller (larger) than a certain predefined threshold, than the respective bit node may resemble a logical one (zero), or vice versa (decoding decision).

In some examples, the decoding of the coded signal may employ a min-sum algorithm. The min-sum algorithm is a technique which enables to determine the result signal by decoding the encoded signal in a computationally efficient manner at a high accuracy. The min-sum algorithm relies on updating the check nodes considering a minimum value of the bit node values; and updating the bit node values considering a sum of the check node values. Corresponding update messages are passed along the edges of the graph connecting the check nodes and the bit nodes.

The techniques disclosed herein are generally applicable for various communication systems. Examples include such communication systems which communicate a coded signal according to Discrete Multitone (DMT) modulation and/or Orthogonal Frequency Division Multiplexing (OFDM) modulation. Examples include the Institute of Electrical and Electronics Engineers (IEEE) 802.11 Wireless Local Area Network (WLAN) communication protocol and the Third Generation Partnership Project (3GPP) Long-Term Evolution (LTE) or Universal Mobile Telecommunications system (UMTS) protocol. Further examples include Bluetooth and satellite communication and power line communication, e.g., according to ITU-T G.9955 (G.hn). For illustrative purposes only, hereinafter, a particular focus will be put on physical channels that are implemented via a copper wire and establish communication channels according to the DSL protocol. The DSL protocols include ITU-T G.992.X (ADSL and ADSL 2+), G.993.1 (VDSL1), G.993.2 (VDSL2), and G.9700/G.9701 (G.Fast).

E.g., the various techniques disclosed herein can be applicable for communication system employed for the Internet of Things (IoT) where a large number of devices communicates. Here, robust encoding and efficient decoding can be desirable.

Making reference to FIG. 1, data 131 is sent and/or received (communicated) via a first physical channel 151 and second data 132 is communicated via a second physical channel 152. The first data 131 and second data 132 may be control data, higher-layer payload data, and/or training data. Techniques disclosed herein generally relate to uni-directional and/or bidirectional communication, e.g., upstream (US) and/or downstream (DS) communication. Depending on US or DS communication, corresponding transceivers 101, 111, 102, 112 may operate as transmitters or receivers. Communicating via the physical channels 151, 152 may be according to a frequency-division duplexing scheme (FDD) or according to a time-division duplexing scheme (TDD).

The first and second physical channels 151, 152 experience mutual crosstalk, i.e., the first physical channel 151 (second physical channel 152) experiences first crosstalk 161 (second crosstalk 162) from the second physical channel 152 (first physical channel 151). Sometimes, this mutual crosstalk is also referred to as alien crosstalk. The crosstalk 161, 162 may comprise FEXT and/or NEXT.

The first and second physical channels 151, 152 also experience intrinsic crosstalk. So-called impulse noise may hit a specific physical channel 151, 152. In the various examples disclosed herein, the link loss of the physical channel 151 may be detected based on the temporal evolution of the received coded signal in a time interval having a duration in the range of 3-50 milliseconds, preferably in the range of 5-8 milliseconds.

Figure 2:
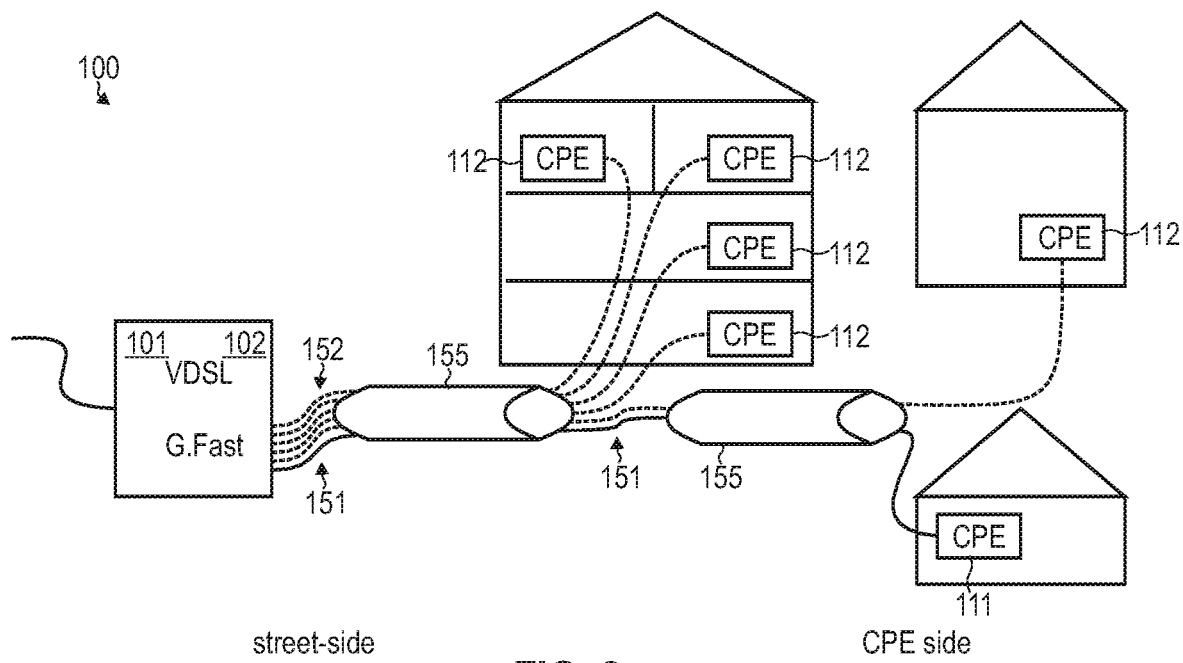
FIG. 2 schematically illustrates a deployment scenario of communicating via a physical channel according to DSL technology.

FIG. 2 illustrates aspects of a typical VDSL2 deployment scenario. The physical channels 151, 152 implemented as copper wires connect the Digital Subscriber Line Access Multiplexer (DSLAM) 101, 102 to the VDSL2 transceiver units, sometimes referred to as remote terminals, at physical separated individual residences comprising customer premises equipment (CPE) 111, 112. The physical channels 151, 152 share common cable binders 155 which increases NEXT and FEXT. VDSL2 employs DMT modulation with up to 4096 subcarriers located on frequencies spaced by 4.3125 kilohertz or 8.625 Kilohertz. Due to the multiple physical channels 151, 152 connected to the DSLAM 101, 102 and sharing a cable binder 155, NEXT and FEXT can be prominent.

Typically, NEXT is prominent above 1-2 MHz. Because of this, VDSL2 communication channels use non-overlapping DS/US frequency bands in FDD up to 30 MHz. This significantly mitigates NEXT. Thus, with NEXT being largely eliminated due to the FDD, FEXT typically dominates the remaining noise 161, 162. Crosstalk cancellation—also referred to as vector engine calculation for removing FEXT—significantly reduces the FEXT, thus effecting a performance improvement.

While with respect to FIG. 1 and to a scenario has been disclosed where the first and second physical channels 151, 152 are adjacent to each other, in other scenarios only a single physical channel 151, 152 may be present and noise may be dominated by intrinsic sources.

Hereinafter, techniques are illustrated which enable to protect communication on the physical channel 151 against errors due to noise, etc.

Figure 3:
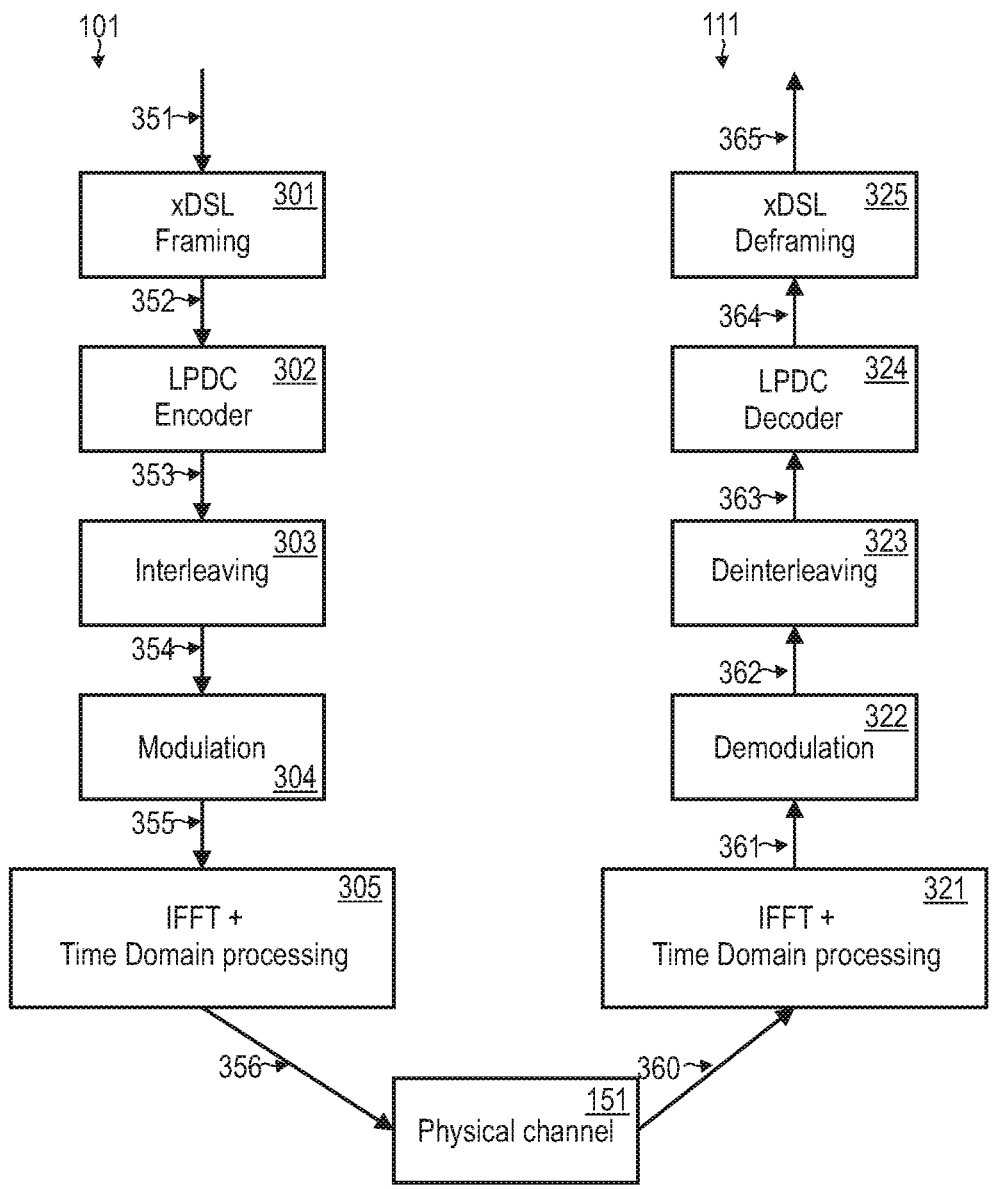
FIG. 3 schematically illustrates coding and decoding of a signal for communication via the physical channel.

FIG. 3 illustrates an example which relies on LDPC-encoding to protect against transmission errors. FIG. 3 illustrates an OFDM-based communication system. Here, combined FEC based on LDPC-checksums comprised in transmission frames, time and/or frequency interleaving, and/or Viterbi encoding is used for combating the effects of impulse noise affecting the physical channel 151. The LDPC-encoding provides an extra redundancy to the Viterbi encoding. Sometimes, the LDPC-encoding is thus referred to as redundancy encoding or second-stage encoding.

The signal transmitted via the physical channel 151 is encoded and modulated by the transmitter 101 and decoded and demodulated by the receiver 111. For this, the OFDM-based communication system of FIG. 3A employs a plurality of carriers or tones which act as separate communication (sub-)channels implemented via the physical channel 151 to carry information between the transmitter 101 and the receiver 111. Each carrier is a group of one or more frequencies defined by a center frequency and a predefined bandwidth.

The physical channel 151 is subject to various types of interference and noise. Interference and noise can corrupt the signal 360 received at the receiver 111 if compared to the signal 356 transmitted at the transmitter 101. Some sources of interference and noise can be modeled as additive white caution noise (AWGN). The impact of AWGN can be reduced greatly by channel estimation and channel decoding employing a Viterbi decoder. Channel estimation typically computes the signal-to-noise ratio (SNR) of the received signal 256 at the receiver 111. According to ODFM techniques, based on the computed SNR of each carrier, the number of data bits loaded on each carrier is determined (bit loading). Lower bit loading typically improves robustness of communication against errors.

Now explaining the functioning of the OFDM-based communication system of FIG. 3 in detail, at the transmitter 101, packetized data 351 is mapped to transmission frames at framing 301. The data 352 is then encoded by LDPC-encoding 302 to facilitate the FEC. An interleaver 303 interleaves the encoded data 353, e.g., in time domain, to increase a robustness against impulse noise. The interleaved data 354 is then further encoded, e.g., using a Trellis coded modulation (TCM) encoder 304 or a QAM encoder (the latter not shown in FIG. 3A). The encoding at 304 further modulates the signal 354 onto different carriers of a DMT. Time and frequency domain processing is then performed at 305, e.g., comprising further interleaving and/or modulation onto different carriers in the high frequency spectrum and/or digital-to-analog conversion.

Thus, a coded signal 356 is communicated via the physical channel 151 and received by a receiver 111. First, the coded signal 360 is processed in time and frequency domain 321; e.g., samples of the received analog signal are converted into digital domain. Further, data of different carrier frequencies can be separated by employing inverted Fast Fourier Transformation (IFFT). Thus, a coded signal 361 is obtained in digital domain.

A first-stage decoder 322 then decodes the signal 361. E.g., the decoder 322 can be a QAM decoder or a unit combining QAM decoding and Viterbi decoding. In the example of FIG. 3, a Viterbi decoder 322 is employed. The decoder 322 attempts to reconstruct the symbols input into the encoder 304 in view of potential corruption by noise on the physical channel 151. In case the encoder 304 uses QAM encoding, the decoder 322 also uses QAM decoding. In case the encoder 304 uses TCM encoding—which includes QAM encoding—, the decoder 322 also uses QAM decoding, followed by Viterbi decoding.

The reconstructed symbols are output by the decoder 322 as signal 362 and are input to a deinterleaver 323. The deinterleaver 323 produces the interleaved data as signal 363 which is provided to a second-stage decoder 324, i.e., in the example of FIG. 3, an LDPC-decoder 324. The decoder 324 provides the finally decoded result signal 364 to a de-framing unit 325 which strips off the transmission frames to provide higher-layer packetized data 365.

First, details regarding the LDPC encoder 302 are explained. LDPC codes are used for correcting errors resulting from the noisy physical channel 151.

Referring to FIG. 4, a binary LDPC code is defined by a parity check matrix H, 400 of size (n−k)×n whose elements are "0" and "1". The parity check matrix 400 is multiplied with the uncoded, raw signal 352 to obtain the coded signal 353, sometimes referred to as codeword. There are n bits per codeword 353 with k message bits (upper part in FIG. 4) and m=n−k parity check bits (lower part in FIG. 4); in the example of FIG. 4, m=n−k=4 and k=8. Assuming that the parity check matrix 400 has full rank, the code rate r (ratio of message bits to total bits) is k/n.

The parity check matrix 400 may be interpreted as follows: The m=(n−k) rows of the parity check matrix 400 represent parity checks, and the n columns of the parity check matrix represent codeword bits. A "1" in row i, column j indicates that bit j is included in parity check i. For example, for the parity check matrix 400 as illustrated in FIG. 4, the 8 parity checks are:

b2+b4=0;
b1+b2=0;
b2+b3=0;
b1+b4=0;
b1+b4=0;
b2+b3=0;
b3+b4=0;
b1+b3=0.

The parity checks can be visualized in graph notation, as illustrated in FIG. 5A. The graph 500 has m check nodes corresponding to m rows of the parity check matrix 400, and other n bit nodes corresponding to n columns of the parity check matrix 400 (in FIGS. 4 and 5: m=4 and n=8).

Quasi-cyclic LDPC codes are used if different application like G.hn and WLAN. These codes have special structure so encoding and decoding is facilitated.

The goal of an LDPC decoder algorithm is to determine the probabilities of the bits of the coded signal 363. Here, additional information can be taken into account, e.g., from initial channel information such as probability metrics from the constellation decoder 322 and the structure of the parity check matrix.

The parity check matrix imposes constraints: A parity check sums to zero, so the probability of one bit in a parity check is constrained by the probabilities of the other bits in the parity check. This constraint is used to derive partial probability information about a bit in an operation known as the update of a check node 501. Each bit of the result signal 364—represented by the bit nodes 502—is typically part of a plurality of parity checks (cf. FIG. 5A where each bit node 502 is connected with a plurality of check nodes 501). The probability information from each parity check can be combined for more complete probability information about the bit. The process of combining probability information about a bit is known as the update of a bit node value.

Hereinafter, details of updating bit node values and check node values when decoding are provided. Let C be a regular LDPC code of length n and dimension k whose parity-check matrix H with (n-k) rows and n columns. Assume code word, $c=[c_1, c_2, c_3, \ldots, c_N]^T$. These codeword will be mapped to QAM constellation and transmit vector 356 $t=[t_1, t_2, t_3, \ldots, t_N]^T$. Assume, this data will be transmitted through AWGN physical channel 151 with variance $\sigma=N_0/2$. Received data vector 360 $r=[r_1, r_2, r_3, \ldots, r_N]^T$, where $r_n=t_n+v_n$ and $v^n$ is AWGN with zero mean and a variance. Following notations will be used for message-passage algorithms running on bipartite graph 500 and probabilities values in log-likelihood ratio (LLR) form:

$L_i$: A priori information of bit node i;
$L^i$: A posteriori information of bit node i;
$R_{ji}$: The check to bit message from i to j;
$Q_{j,i}$: The bit to check message from j to i.

Iterative decoding is employed using a number of iterations. Depending on the overall accuracy in decoding, the input LLR messages can be restricted to a lower precision at the input before updating the check node 501 or bit node 502 values. E.g., where a 10-bit precision in decoding is required, 3-bit may be reserved for the updating such that the LLR of the messages may be restricted to 7-bit accuracy.

On type of decoding of LDPC-encoded signals employs the sum-product algorithm which is explained below:

A priori information, $L_i=-r_i$;
Bit to check message initialization from i to j: $Q_{ji}=L_i$ Check node Processing/bit node updating:

$$R_{ji} = \log \frac{1 + \prod_{i \in N(j)\setminus i} \tanh\left(\frac{Q_{i',j}}{2}\right)}{1 - \prod_{i \in N(j)\setminus i} \tanh\left(\frac{Q_{i',j}}{2}\right)} \quad (1)$$

A posteriori information:

$$L^j = L_j + \sum_{j \in Q(i)} R_{ji}$$

Bit node Processing/Check node updating:

$$Q_{ji} = L^j + \sum_{i' \in Q(j)/i} R_{ji} \quad (2)$$

Decoding Decision: $L^j \rangle 0$, $\bar{c}_n=0$, else $\bar{c}_n=1$, hence the threshold with which the bit node value is compared is zero.

Then, the constraints imposed by the parity check matrix 400 can be tested: If H $\bar{c}_n=0$, code word $C_n$ will be valid code word and decoding will stop. As can be seen, convergence is tested by applying the parity check matrix to the code word $C_n$. This is typically computationally expensive.

If the codeword does not fulfill the constraints imposed by the parity check matrix 400, a further iterations is executed—until predefined number of iterations to reach maximum iteration. Then, the decoding decision is forcedly taken.

The sum-product algorithm has certain drawbacks and limitations. A main challenge when employing the sum-product algorithm is the check processing which is typically computationally intensive.

To reduce the computational burden, the min-sum algorithm can be employed. The min-sum algorithm is an approximation of the sum-product algorithm, as will be explained below.

Using $$2\tanh^{-1}(x) = \log \frac{1+x}{1-x},$$

check node processing according to Eq. 1 can be written as:
$R_{ji}=2 \tanh^{-1}\Pi_{i' \in N(j)\setminus i} \tanh(Q_{i',j}/2)$ This can be further modified as
$R_{ji}=2 \tanh^{-1}\Pi_{i' \in N(j)\setminus i} \text{sign}(Q_{i',j})\Pi_{i' \in N(j)\setminus i} \tanh(|Q_{i',j}|/2)$ $R_{ji}=\Pi_{i' \in N(j)\setminus i} \text{sign}(Q_{i',j})2 \tanh^{-1}\Pi_{i' \in N(j)\setminus i} \tanh(|Q_{i',j}|/2)$ $2 \tanh^{-1} \Pi_{i' \in N(j)\setminus i} \tanh(|Q_{i',j}|/2)$ work similar to (1/x). This function dominate by min value of $Q_{i',j}$.

Thus, one gets for check node processing/bit node updating:

$$R_{ji} = \prod_{i' \in N(j)\setminus i} \text{sign}(Q_{i',j}) \min_{i' \in N(j)\setminus i} (|Q_{i',j}|) \quad (3)$$

As can be seen, at each iteration of check node processing, $R_{ji}$ (sometimes referred to as delta value, because it is added to the bit node 502 values) cumulates for all check nodes using the minimum value. Thus, an extremum of the check node 501 is used for updating the bit node 502 values.

The check node 501 values can be updated based on Eq. 2, i.e., may be based on a sum of the bit node 502 values according to the min-sum algorithm.

FIG. 5B illustrates source code for bit node updating based on the check node processing of Eq. 3. Here, lines 6 and 8 denote selection of the first-order and second-order minimum according to Eq. 3. Lines 10 and 12 correspond to the signum function of Eq. 3. Line 13 corresponds to updating the bit node 502 value based on the check node 501 values thus accumulated. Then, the check nodes are updated based on the new bit node 502 values, line 14. Each column of the parity check matrix 400 is updated independently.

As can be seen from lines 13 and 14 of the source code of FIG. 5B, the bit node 502 values and check node 501 values are alternatingly updated. Further, the bit node 502 values and check nodes 501 values are updated for a number of iterations. Typically, at every iteration the value of the minimum of the check node value grows; likewise, the bit node values may grow. This can cause conflicts with the memory available for storing the check node values and bit node values.

In detail, the bit node 502 values are represented at a certain limited first precision, e.g., due to the memory restrictions. Because only a limited first precision is available for representing the bit node values, a saturation may occur at least for some bit nodes 502 having an initial value already close to the precision threshold when updating at line 13. This effectively results in updating bit node 502 values connected by the same constraint with different minima value. Such a situation can lead to errors in decoding the coded signal 363. In particular, convergence of the algorithm can be prevented or may take comparably long.

Hence, it may be desirable to effect updates of the bit node 502 values of bit nodes 502 connected by a common constraint of the column of the parity check matrix 400 (i.e., bit nodes 502 connected to one and the same check node 501) using one and the same delta value according to Eq. 3 and line 13.

To achieve this, the precision of updating the bit node 502 values is restricted in some scenarios—if compared to the precision with which the final bit node 502 values are determined. Hence, a second precision of updating the bit node 502 values is below the first precision with which the result signal 364, 365 is determined, i.e., the first precision with which the bit node 502 values are stored when applying the decoding decision.

Restricting the second precision of updating the bit node 502 values can be implemented in various ways. In one example, the minimum of the check node 501 values is constrained to a predefined threshold. The predefined threshold may be associated with the second precision. I.e., the predefined threshold may correspond value that can be represented by a smaller number of bits (bit-width) associated with the second precision—if compared to the number of bits used for representing the bit node 502 values at the first precision. Hence, even if the minimum of the check node 501 values exceeds the threshold defined by the second precision, only the minimum defined by the threshold is selected for updating the bit node 502 values. This may be seen as cropping any excess of the minimum values beyond the threshold, thus clipping the minimum values to the threshold.

In the scenarios explained above, it is not required to restrict the updating of the check node 501 values to the second precision. In various examples, for updating of the check node values, e.g., based on Eq. 2, can be implemented at the first precision.

Based on techniques of updating at the lower, second precision, it is possible to ensure that with increasing numbers of iterations of decoding, the internal accuracy of the log-likelihood ratio values used for updating the bit node 502 values grows. This is achieved by constraining the minima values of the check nodes/the log-likelihood ratio values in accordance with the disclosure above.

E.g., within a single iteration of decoding of a coded signal 363 employed for communication according to the G.hn communication protocol, there can be up to eight bit nodes 502 connected to a single check node 501; i.e., saturation of a corresponding minimum value can affect up to eight bit nodes 502. In particular, for a single iteration, in such a scenario it is possible that the internal bit-width of the bit node 502 values grows by three bits.

Further, to further illustrate the impacts of saturation of the minimum value, the following example is considered. If the minimum value of check nodes 501 is high, a situation can occur where, e.g., a single bit node 502 value—out of, in total, six connected bit nodes 502—is updated wrongly and saturates. The remaining five bit node 502 values do not saturate. The falsely updated bit node 502 value can be scaled back differently if compared to the other five bit node 502 values not having saturated. This leads to an error injection and hence leads to divergence. In particular, the basic principle of the LDPC-decoder algorithm is violated which requires that bit nodes 502 connected to the same check nodes 501 are required to be updated with similar minimum values, according to Eq. 3. The techniques illustrated herein are motivated by the finding that such saturation of the bit node 502 values can be a major cause behind divergence of the algorithm and indeterministic behavior of the LDPC decoding at high iterations—such as may be present for low Quadrature amplitude modulation constellations and low signal-to-noise ratio or for cases where a low number of iterations is present at high QAM constellations with high signal-to-noise ratio.

Figure 6A:
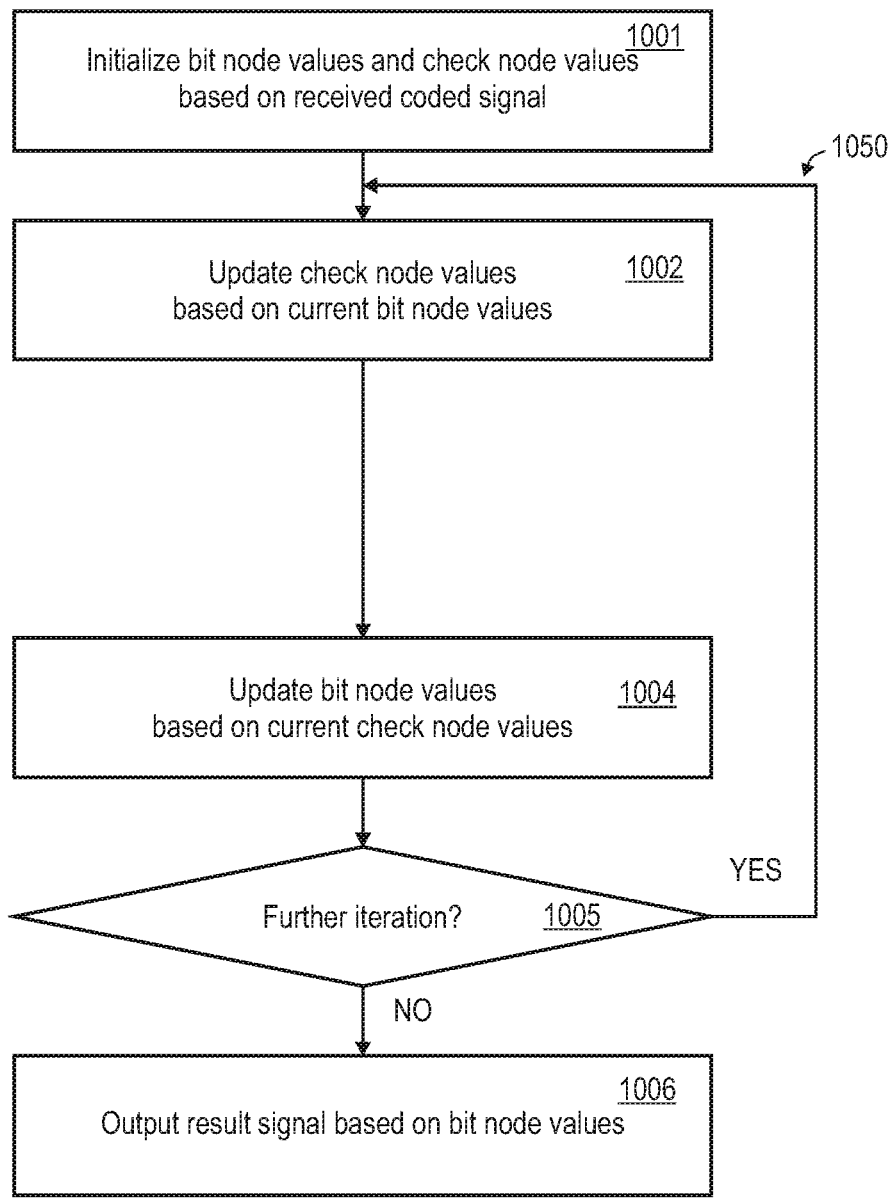
FIG. 6A is a flowchart of a method according to various embodiments.

Turning to FIG. 6A, a method according to some examples is illustrated. The method facilitates decoding. First, the check node 501 values and bit node 502 values are initialized, based on the coded signal 363 received by the LDPC decoder 324. E.g., the bit node 502 values can be initialized based on the message bits of the received coded signal 363, while the check node 501 values can be initialized based on the parity check bits of the received coded signal 363.

Next, at 1002, the check node 501 values are updated based on the current bit node 502 values, e.g., considering Eq. 2 based on a sum of the bit node 502 values of the bit nodes 502 connected to a given check node 501. Next, the bit node 502 values are updated based on the current check node 501 values 1004. 1002 and 1004 may be implemented using the min-sum algorithm. Here, the check node 501 values may be checked for the corresponding minimum.

At 1005 it is checked whether a further iteration is required. If a further iteration 1050 is required, 1002-1005 are executed anew. Otherwise, at 1006, the result signal 364 is output by the LDPC decoder 324.

According to the techniques disclosed above, at 1004, the minimum values of the check node 501 values can be constrained to the second precision which is lower than the first precision with which the result signal 364 is determined. A respective predefined threshold—e.g., corresponding to a bit-width which is lower than the bit-width with which the bit node 502 values and/or check node 501 values are stored—may be employed for said constraining. E.g., the predefined threshold may correspond to a bit width two bits or three bits below the bit width with which the bit node 502 values and/or check node 501 values are stored.

Figure 6B:
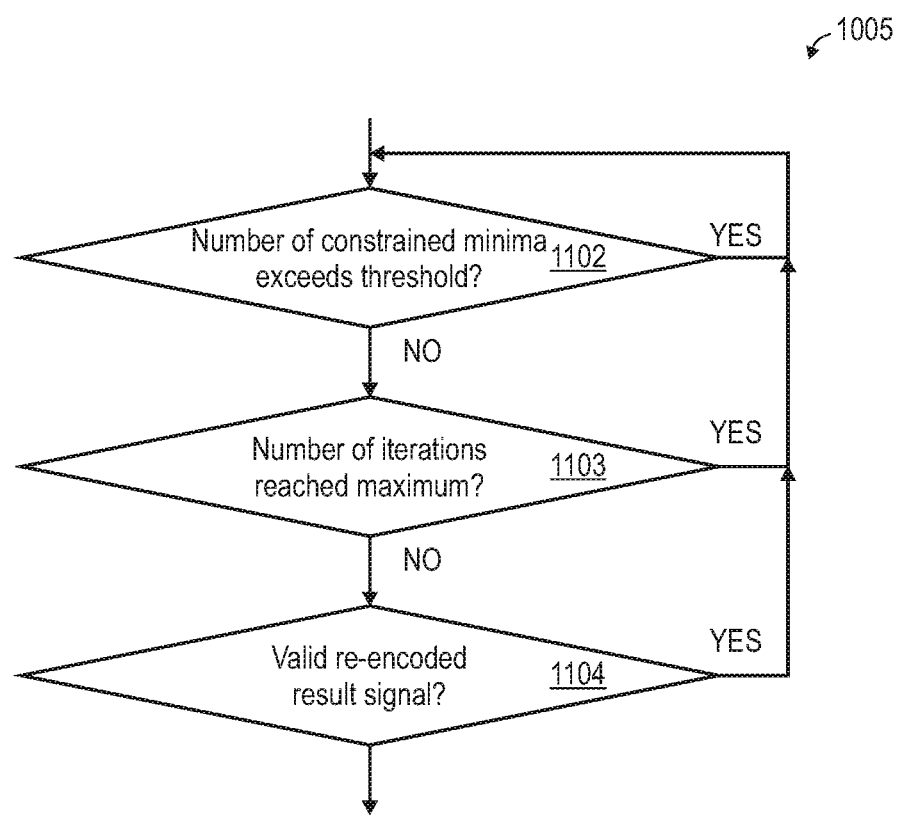
FIG. 6B is a flowchart of a method according to various embodiments.

With respect to 1005, details are illustrated in FIG. 6B. in particular, with respect to FIG. 6B techniques of dynamically adjusting the number of iterations 1050 for different executions of decoding are illustrated. In detail, when checking at 1005 if a further iteration 1050 is required, convergence of the LDPC decoding algorithm can be checked.

Figure 7:
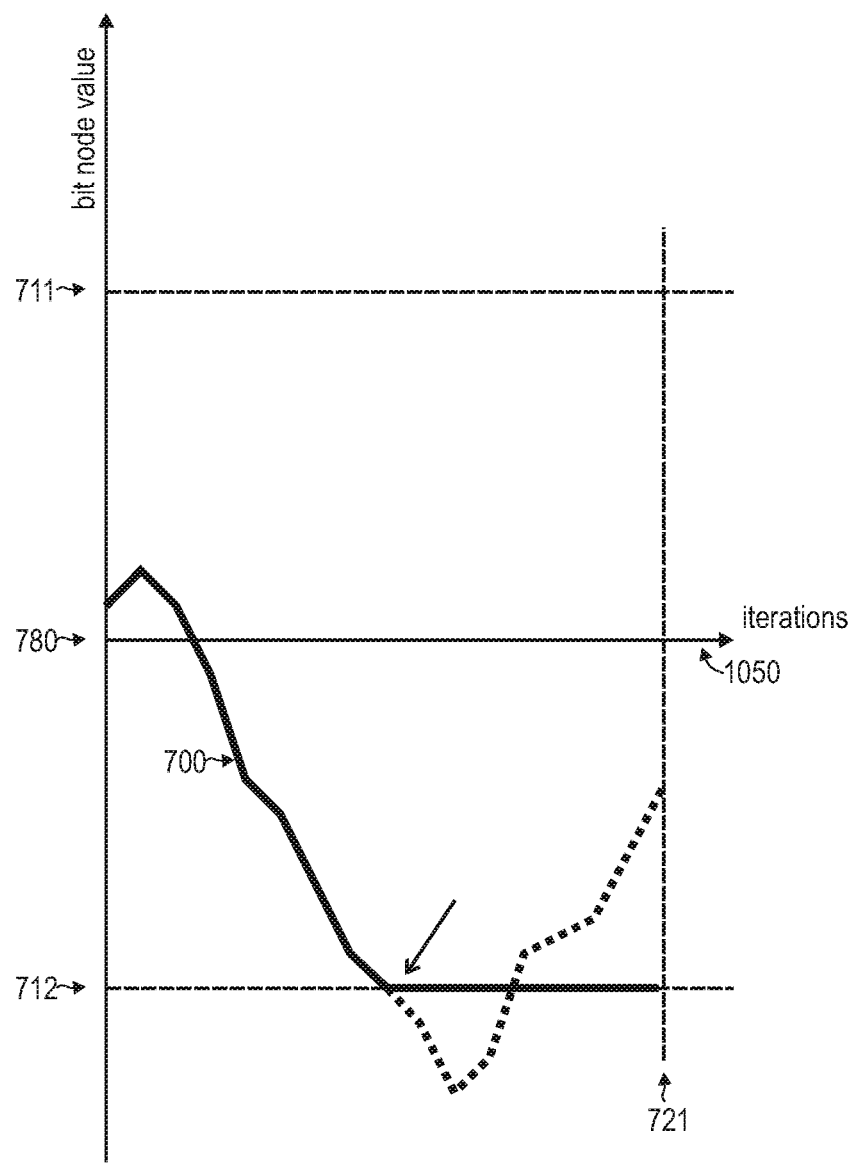
FIG. 7 illustrates convergence of values of the bit nodes over a plurality of iterations of alternatingly updating the bit node values and the check node values.

Here, it can be checked whether the bit node 502 values 700 have reached a certain predefined threshold 711, 712 (see FIG. 7 where the values 700 of a single bit node 502 are illustrated as a function of iterations). If the predefined threshold 711, 712 is reached, the decoding decision can be taken by comparing the value 700 of the bit node 502 with the decision threshold 780.

In FIG. 7, the dotted line illustrates evolution of bit node 502 values 700 for decoding according to min-some reference implementations. As can be seen, even after the bit node 502 values 700 have reached the convergence threshold 712, the values 700 change and, subsequently, significantly deviate from the convergence threshold 712. In particular, the values 700 even come close to the decision threshold 780 so that it cannot be assumed that the algorithm converged.

In FIG. 7, the full line illustrates evolution of bit node 502 values 700 for decoding according to the min-sum algorithm according to techniques as disclosed herein. In particular, the minimum values of the check nodes 501 are constrained to a bit-width of the 3 bit; while the precision with which the values of the bit nodes 502 and the check nodes 501 are determined corresponds to a bit-with of eight bit. As illustrated by the arrow in FIG. 7, convergence of the bit node 502 values 700 occurs comparably fast and is stable. Therefore, an accuracy in decoding can be increased.

Referring again to FIG. 6B, typically, the number of iterations 1050 required for convergence depends on a noise condition of the physical channel 151. E.g., for low noise, convergence can be comparably fast, while for high noise, a comparably large number of iterations 1050 can be required until convergence. In a simple scenario, it is thus possible to determine a predefined maximum number 721 of iterations 1050 based on the noise condition of the physical channel 151. A corresponding check can be made, 1103, when judging at 1005 if a further iteration 1050 is required.

A further decision criterion that may be taken into account alternatively or additionally when judging, at 1005, if a further iteration 1050 is required, is the evaluation of the saturation of the number of rows where the minimum values have reached a defined threshold value. I.e., it is possible to monitor for the minimum of the check node 501 values over the number of iterations 1050, 1102, and to dynamically adjust the number of iterations 1050 based on the monitoring of the minimum of the check node 501 values. To give an example: if 80% of the rows have hit the minimum values, convergence of the LDPC decoder 324 can be assumed. Such a scenario may be implemented by comparing—for each bit node 502—the minimum of the check node 501 values of the check nodes 501 associated by constrains with the respective bit node 502 with a predefined threshold. Then, it is possible to count if a number of bit nodes 502 having an associated saturated minimum of the check node 501 values exceeds the predefined threshold.

A further decision criterion that may be taken into account alternatively or additionally when judging, at 1005, if a further iteration 1050 is required, may be the evaluation of the bit node 502 values 700 and/or the check node 501 values. E.g., at least one of the bit node 502 values 700 and the check node 501 values may be monitored over a number of iterations 1050. Then, the number of iterations 1050 may be dynamically adjusted based on said monitoring of the at least one of the bit node 502 values 700 and the check node 501 values. E.g., the bit node 502 values 700 may be compared with a predefined threshold 711, 712. If the bit node 502 values 700 of the respective number of bit nodes 502 reach the predefined threshold 711, 712, convergence of the LDPC decoder 324 can be assumed. Again, it may be possible to compare the number of bit nodes 502 having values 700 above the predefined threshold 711, 712; if this number exceeds a further threshold, convergence of the LDPC decoder 324 can be assumed.

Based on such techniques of dynamically adjusting the number of iterations 1050, a computationally inexpensive technique of checking for convergence of the LDPC decoder 324 may be implemented. In particular, computational efforts may be significantly lower than techniques according to reference implementations, where the codeword is re-encoded based on the parity check matrix to determine if the LDPC decoder 324 has converged. Further, the effect of reduced power consumption—which may be particularly important for applications within the IoT—can be achieved.

While with respect to FIGS. 6A and 6B, a certain sequence of steps has been discussed, in other examples, a different sequence may be adapted. Further, it may be possible to combine or split certain steps as disclosed above.

Figure 8:
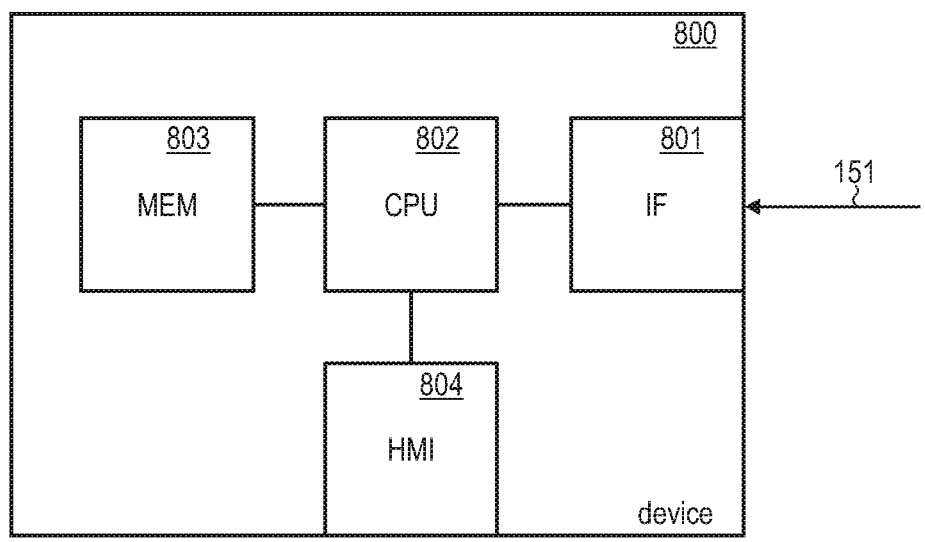
FIG. 8 is a schematic diagram of a device according to various embodiments.

FIG. 8 is a schematic illustration of a device 800 according to various embodiments.

E.g., the device 800 may implement a transceiver 101, 102, 111, 112. The device 800 comprises an interface 801 configured to communicate on the physical channel 151 in US and/or DS. E.g., the interface 801 may comprise at least parts of an analog front end and/or a digital front end. The interface 801 is coupled to a processor 802. The processor 802 is coupled to a memory 803, e.g., a non-volatile memory. The processor 802 is further coupled to a human machine interface 804. The memory 803 may store program code that may be executed by the processor 802. Executing the program code may cause the processor 802 performing techniques disclosed herein with respect to decoding a coded signal, applying a min-sum algorithm, constraining the minimum values of check nodes, dynamically adjusting a number of iterations for decoding, monitoring bit node values and/or check node values and considering said monitoring when dynamically adjusting the number of iterations, monitoring the minimum values of check nodes and considering said monitoring when dynamically adjusting the number of iterations, etc.

Summarizing, above techniques have been illustrated which enable to implement decoding of a coded signal computationally inexpensively and at a high accuracy. These techniques rely on constraining the minimum values of check nodes in a min-sum algorithm in order to avoid indeterministic saturation of bit node values. These techniques further rely on dynamically adjusting a number of iterations of alternating the updating bit node values and check node values based on each other.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

The invention claimed is:

1. A method, comprising:
   receiving a coded signal via a physical channel, the coded signal being encoded by a parity check matrix,
   decoding the coded signal to determine a result signal, wherein said decoding alternatingly updates, for each one of a number of iterations, bit node values representing bits of the result signal and check node values representing constraints of the parity check matrix,
   wherein said decoding determines the result signal at a first precision and updates at least partly at a second precision lower than the first precision.

2. The method of claim 1,
   wherein said decoding updates the bit node values at the second precision based on the check node values.

3. The method of claim 1,
   wherein said decoding updates the check node values and the bit node values based on a min-sum algorithm.

4. The method of claim 1,
   wherein said decoding updates the check node values at the first precision based on the bit node values.

5. The method of claim 4,
   wherein said decoding updates the check node values and the bit node values based on a min-sum algorithm,
   wherein said updating of the check node values is based on a sum of the bit node values according to the min-sum algorithm.

6. The method of claim 1,
   wherein the second precision is at least two bits lower than the first precision.

7. The method of claim 1,
   wherein the first precision is in the range of 5-15 bits.

8. The method of claim 1, further comprising:
   controlling a memory to store the bit node values and the check node values at the first precision.

9. The method of claim 8,
   selecting the second precision based on storage constraints of the memory.

10. The method of claim 1, further comprising:
    selecting the second precision based on a noise condition of the physical channel.

11. A method, comprising:
    receiving a coded signal via a physical channel, the coded signal being encoded by a parity check matrix,
    decoding the coded signal to determine a result signal, wherein said decoding alternatingly updates, for each one of a number of iterations, bit node values representing bits of the result signal and check node values representing constraints of the parity check matrix,
    wherein said decoding determines the result signal at a first precision and updates
    wherein said decoding updates the bit node values at the second precision based on the check node values,
    wherein said decoding updates the bit node values based on an extremum of the check node values, and
    wherein the method further comprises:
        constraining the extremum of the check node values to a predefined threshold associated with the second precision.

12. A method, comprising:
    receiving a coded signal via a physical channel, the coded signal being encoded by a parity check matrix,
    decoding the coded signal to determine a result signal, wherein said decoding alternatingly updates, for each one of a number of iterations, bit node values representing bits of the result signal and check node values representing constraints of the parity check matrix,
    wherein said decoding determines the result signal at a first precision and updates at least partly at a second precision lower than the first precision,
    wherein said decoding updates the check node values and the bit node values based on a min-sum algorithm,
    wherein said decoding updates the bit node values based on an extremum of the check node values,
    wherein the method further comprises:
        constraining the extremum of the check node values to a predefined threshold associated with the second precision,
    wherein the extremum of the check node values is a first order minimum or a second order minimum according to the min-sum algorithm.

13. A device, comprising:
    a receiver configured to receive a coded signal via a physical channel, the coded signal being encoded by a parity check matrix,
    at least one processor configured to decode the coded signal to determine a result signal, wherein said decoding alternatingly updates, for each one of a plurality iterations, bit node values representing bits of the result signal and check node values representing constraints of the parity check matrix,
    wherein said decoding determines the result signal at a first precision and updates at least partly at a second precision lower than the first precision.

* * * * *